United States Patent [19]
Smelser

[11] Patent Number: 4,782,487
[45] Date of Patent: Nov. 1, 1988

[54] MEMORY TEST METHOD AND APPARATUS

[75] Inventor: Donald W. Smelser, Bolton, Mass.

[73] Assignee: Digital Equipment Corporation, Maynard, Mass.

[21] Appl. No.: 50,847

[22] Filed: May 15, 1987

[51] Int. Cl.$^4$ ............................................. G06F 11/22
[52] U.S. Cl. ..................................... 371/21; 371/27
[58] Field of Search ................ 371/21, 13, 27, 38, 371/51, 70; 365/201

[56] References Cited

U.S. PATENT DOCUMENTS

| | | | |
|---|---|---|---|
| 3,576,982 | 3/1971 | Duke | 371/13 |
| 4,271,519 | 6/1981 | Hall | 371/38 |
| 4,429,389 | 1/1984 | Catiller | 371/21 |
| 4,458,349 | 7/1984 | Aichelmann | 371/38 X |
| 4,715,034 | 12/1987 | Jacobson | 371/21 |

*Primary Examiner*—Jerry Smith
*Assistant Examiner*—Robert W. Beausoliel
*Attorney, Agent, or Firm*—Finnegan, Henderson, Farabow, Garrett & Dunner

[57] ABSTRACT

A method and apparatus for memory testing is described. A first pattern of data is written into the memory in a pseudo-random address sequence determined by an address generator. The first pattern is read from the memory and checked for any error. A second pattern that is the complement of the first pattern is written into the memory in a pseudo-random address sequence determined by the address generator. The second pattern is read from the memory and checked for any errors. A third pattern of data is written into the memory in the pseudo-random address sequence determined by the address generator. The third pattern of data has the effect of complementing respective check bits which are the same for the first pattern of data and the second pattern of data. The third pattern is read from memory and checked for any error.

19 Claims, 7 Drawing Sheets

FIG. 4   ADDRESS LFSR 0 0 0 0 · · · 0 0 1
0 0 0 0 · · · 0 0 0
1 0 0 0 · · · 0 0 0
. . . .

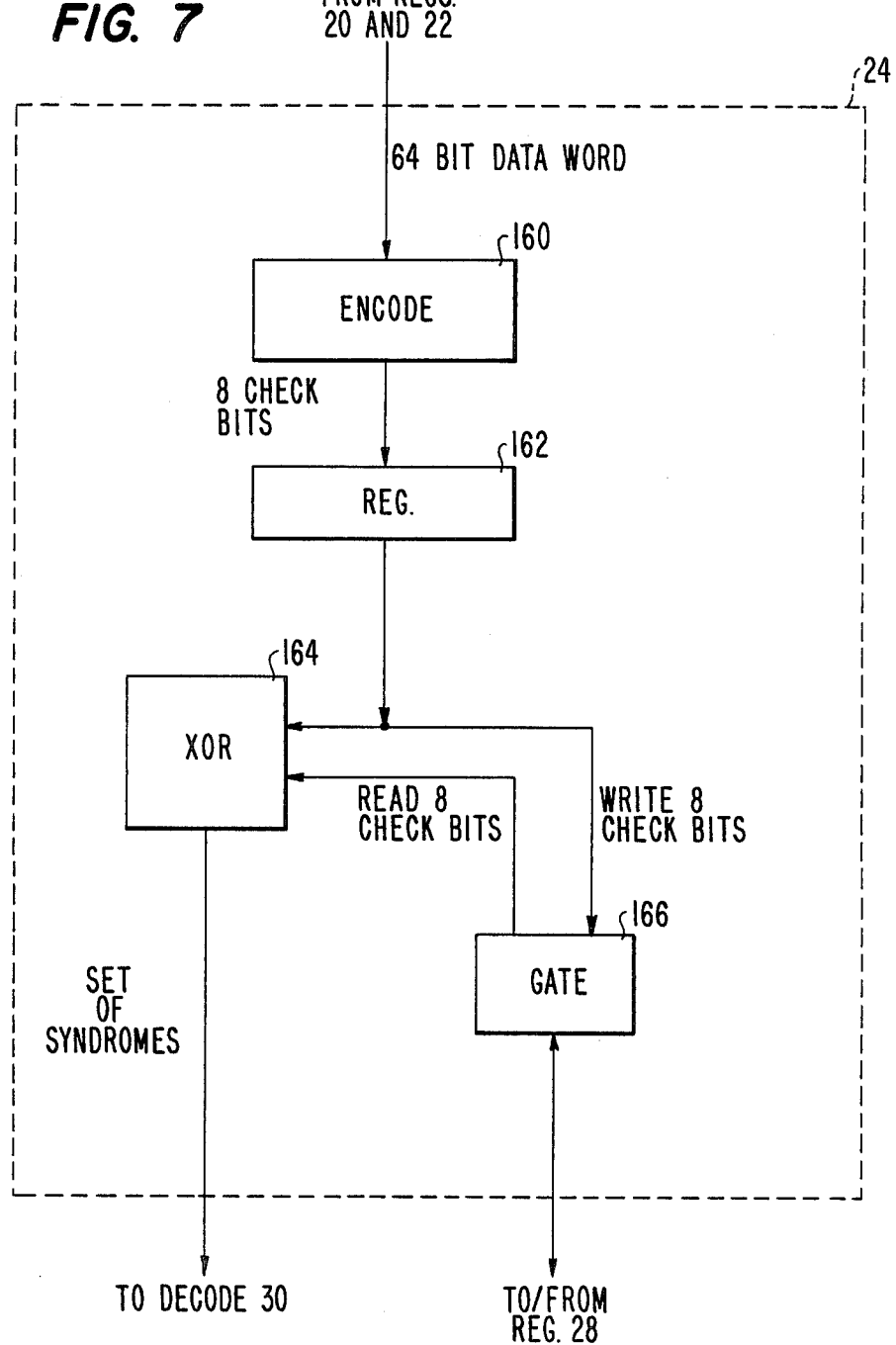

| DATA BIT | S0 | S1 | S2 | S3 | S4 | S5 | S5 | S7 |
|---|---|---|---|---|---|---|---|---|
| 0  | 0 | 0 | 0 | 0 | 0 | 1 | 1 | 1 |
| 1  | 1 | 0 | 0 | 0 | 0 | 0 | 1 | 1 |
| 2  | 0 | 1 | 0 | 0 | 0 | 0 | 1 | 1 |
| 3  | 1 | 1 | 0 | 0 | 0 | 0 | 0 | 1 |
| 4  | 0 | 0 | 1 | 0 | 0 | 0 | 1 | 1 |
| 5  | 1 | 0 | 1 | 0 | 0 | 0 | 0 | 1 |
| 6  | 0 | 1 | 1 | 0 | 0 | 0 | 0 | 1 |
| 7  | 1 | 1 | 1 | 0 | 0 | 0 | 0 | 0 |
| 8  | 0 | 0 | 0 | 1 | 0 | 0 | 1 | 1 |
| 9  | 1 | 0 | 0 | 1 | 0 | 0 | 0 | 1 |
| 10 | 0 | 1 | 0 | 1 | 0 | 0 | 0 | 1 |
| 11 | 1 | 1 | 0 | 1 | 0 | 0 | 0 | 0 |
| 12 | 0 | 0 | 1 | 1 | 0 | 0 | 0 | 1 |
| 13 | 1 | 0 | 1 | 1 | 0 | 0 | 0 | 0 |
| 14 | 0 | 0 | 0 | 1 | 1 | 0 | 1 | 0 |
| 15 | 1 | 0 | 0 | 0 | 1 | 0 | 1 | 0 |
| 16 | 0 | 0 | 0 | 0 | 1 | 0 | 1 | 1 |
| 17 | 1 | 0 | 0 | 0 | 0 | 1 | 0 | 1 |
| 18 | 0 | 1 | 0 | 0 | 0 | 1 | 0 | 1 |
| 19 | 1 | 1 | 0 | 0 | 0 | 0 | 1 | 0 |
| 20 | 0 | 0 | 1 | 0 | 0 | 1 | 0 | 1 |
| 21 | 1 | 0 | 1 | 0 | 0 | 0 | 1 | 0 |
| 22 | 0 | 1 | 1 | 0 | 0 | 0 | 1 | 0 |
| 23 | 1 | 1 | 1 | 0 | 0 | 0 | 1 | 1 |
| 24 | 0 | 0 | 0 | 1 | 0 | 1 | 0 | 1 |
| 25 | 1 | 0 | 0 | 1 | 0 | 0 | 1 | 0 |
| 26 | 0 | 1 | 0 | 1 | 0 | 0 | 1 | 0 |
| 27 | 1 | 1 | 0 | 1 | 0 | 0 | 1 | 1 |
| 28 | 0 | 0 | 1 | 1 | 0 | 0 | 1 | 0 |
| 29 | 1 | 0 | 1 | 1 | 0 | 0 | 1 | 1 |
| 30 | 0 | 0 | 0 | 1 | 1 | 1 | 0 | 0 |
| 31 | 1 | 0 | 0 | 0 | 1 | 1 | 0 | 0 |
| 32 | 0 | 0 | 0 | 0 | 1 | 1 | 0 | 1 |
| 33 | 1 | 0 | 0 | 0 | 0 | 1 | 1 | 0 |
| 34 | 0 | 1 | 0 | 0 | 0 | 1 | 1 | 0 |
| 35 | 1 | 1 | 0 | 0 | 0 | 1 | 0 | 0 |
| 36 | 0 | 0 | 1 | 0 | 0 | 1 | 1 | 0 |
| 37 | 1 | 0 | 1 | 0 | 0 | 1 | 0 | 0 |
| 38 | 0 | 1 | 1 | 0 | 0 | 1 | 0 | 0 |
| 39 | 1 | 1 | 1 | 0 | 0 | 1 | 0 | 1 |

FIG. 8 (cont.)

| | | | | | | | | |
|---|---|---|---|---|---|---|---|---|
| 40 | 0 | 0 | 0 | 1 | 0 | 1 | 1 | 0 |
| 41 | 1 | 0 | 0 | 1 | 0 | 1 | 0 | 0 |
| 42 | 0 | 1 | 0 | 0 | 1 | 0 | 1 | 0 |
| 43 | 1 | 1 | 0 | 1 | 0 | 1 | 0 | 1 |
| 44 | 0 | 0 | 1 | 1 | 0 | 1 | 0 | 0 |
| 45 | 1 | 0 | 1 | 1 | 0 | 1 | 0 | 1 |
| 46 | 0 | 0 | 1 | 0 | 1 | 0 | 1 | 0 |
| 47 | 1 | 0 | 0 | 1 | 1 | 0 | 0 | 0 |
| | | | | | | | | |
| 48 | 0 | 0 | 0 | 0 | 1 | 1 | 1 | 0 |
| 49 | 1 | 0 | 0 | 0 | 1 | 0 | 0 | 1 |
| 50 | 0 | 1 | 0 | 0 | 1 | 0 | 0 | 1 |
| 51 | 1 | 1 | 0 | 0 | 1 | 0 | 0 | 0 |
| 52 | 0 | 0 | 1 | 0 | 1 | 0 | 0 | 1 |
| 53 | 1 | 0 | 1 | 0 | 1 | 0 | 0 | 0 |
| 54 | 0 | 1 | 1 | 0 | 1 | 0 | 0 | 0 |
| 55 | 1 | 1 | 1 | 0 | 1 | 0 | 0 | 1 |
| | | | | | | | | |
| 56 | 0 | 0 | 0 | 1 | 1 | 0 | 0 | 1 |
| 57 | 1 | 0 | 0 | 1 | 0 | 1 | 1 | 1 |
| 58 | 0 | 1 | 0 | 0 | 1 | 1 | 0 | 0 |
| 59 | 1 | 1 | 0 | 1 | 1 | 0 | 0 | 1 |
| 60 | 0 | 0 | 1 | 1 | 1 | 0 | 0 | 0 |
| 61 | 1 | 0 | 1 | 1 | 1 | 0 | 0 | 1 |
| 62 | 0 | 0 | 1 | 0 | 1 | 1 | 0 | 0 |
| 63 | 1 | 0 | 0 | 1 | 1 | 0 | 1 | 1 |
| | | | | | | | | |
| C0 | 1 | 0 | 0 | 0 | 0 | 0 | 0 | 0 |
| C1 | 0 | 1 | 0 | 0 | 0 | 0 | 0 | 0 |
| C2 | 0 | 0 | 1 | 0 | 0 | 0 | 0 | 0 |
| C3 | 0 | 0 | 0 | 1 | 0 | 0 | 0 | 0 |
| C4 | 0 | 0 | 0 | 0 | 1 | 0 | 0 | 0 |
| C5 | 0 | 0 | 0 | 0 | 0 | 1 | 0 | 0 |
| C6 | 0 | 0 | 0 | 0 | 0 | 0 | 1 | 0 |
| C7 | 0 | 0 | 0 | 0 | 0 | 0 | 0 | 1 |
| | | | | | | | | |
| BYTE WRITE ERROR CODE | 0 | 1 | 1 | 1 | 1 | 1 | 1 | 1 |

MEMORY TEST METHOD AND APPARATUS

CROSS-REFERENCE TO RELATED APPLICATION

This application is related to patent application Ser. No. 050,839 for "Byte Write Error Code Method and Apparatus," filed on even date herewith.

BACKGROUND OF THE INVENTION

The present invention relates to the field of testing of memory for a digital computer. In particular, this invention relates to a pseudo-random memory test.

There are a number of known schemes for testing computer memories. One prior art method is to write all binary ones or zeros into a memory and then to read from the memory, checking for errors. One problem with that prior art method is its inability to detect whether two or more data lines are shorted together.

Another prior art method is to remain at each memory address long enough to write and read a series of data words at that address, wherein each data word comprises zeros and a single one, and the data words differ in the position of that single one bit. The one bit "walks" through each bit position as the data words are written into and read from the memory. One shortcoming of that prior art method is that it cannot detect whether or not two or more address lines are shorted together, and other prior art testing systems that write the same data into different addresses share the inability to detect whether or not two or more address lines are shorted together.

Some prior art memory testers use a simple increment by one counter to generate memory addresses. Some prior art memory testers employ more than one address counter. One problem with some prior art testers using counters is that some address bits generated by the counter or counters remain the same for relatively long periods of time before changing state.

One prior art method of memory testing known as the Galpat test involves staying at one address while changing data patterns that are written into and read from that address, and then moving onto and doing the same at other addresses. The amount of time it takes to run a Galpat test on a memory is generally proportional to the square of the number of memory addresses tested. Therefore, the amount of time it takes to run a Galpat test increases dramatically for larger memories with significantly more memory addresses.

One prior art way to check data for errors is to use comparators to check the data read from the memory against the data that was written into the memory. The addition of many comparators for testing to an existing circuit design can, however, take up otherwise valuable space on a printdd circuit board or within an integrated circuit.

Another prior art way to check data for errors is to check parity. Various prior art error detecting and correcting codes can be employed, including the Hamming code. The Hamming code offers the ability to detect errors involving two bits and detect and correct errors involving a single bit.

SUMMARY AND OBJECTS OF THE INVENTION

In view of the above background, one of the objects of the present invention is to assure memory address uniqueness by way of memory testing. A further related object of this invention is to assure the independence of the address lines in the memory. In other words, an object of this invention is to provide an indication during testing of whether or not two or more memory address lines are shorted together or shorted to any data line.

Another object of this invention is to assure by way of memory testing the independence of the data lines in the memory. An object of this invention is therefore to provide an indication during testing of whether or not two or more memory data lines are shorted together or shorted to any address line.

A further object of this invention is to store both a one and a zero in each location in the memory in order to provide more complete testing.

Another object of the present invention is to better simulate the randomness of real memory use by providing for pseudo-random addressing of the memory and the storing of pseudo-random data. A further object of this invention is to provide a march through memory addresses and data. Another object of the present invention is to stimulate failure modes not discovered by more regular sequences.

Another object of this invention is to execute a memory test in a relatively short time—for example, in seconds, rather than minutes.

A further object of the present invention is to add a minimum of additional design complexity, including minimizing the gate count, when memory testing circuitry is added to a memory system design.

Another object of the present invention is to use, in the testing of the memory, many of the non-test mode memory circuitry functions. A related object of the present invention is to use as part of the memory tester a portion of the nontest mode memory circuitry.

A further object of the present invention is to improve the memory test coverage of the error detection and correction logic.

These and other objects of the invention are provided for by a method for testing a memory involving writing a pattern of data into the memory in a pseudo-random address sequence determined by an address generator. The first pattern is read from the memory and checked for any error. A second pattern that is the complement of the first pattern is written into the memory in the pseudo-random address sequence determined by the address generator. The second pattern is read from memory and checked for any error. A third pattern of data is written into the memory in the pseudo-random address sequence determined by the address generator. The third pattern of data has the effect of complementing those check bits which had remained the same (i.e., uncomplemented) when the first pattern of data was complemented to generate the second pattern of data. The third pattern is read from memory and checked for any error.

In accordance with the present invention, an apparatus for testing a memory includes means for writing a first pattern of data into the memory in a pseudo-random address sequence determined by an address generator. Means for reading that first pattern from the memory and means for checking that pattern for any error are also provided. Means for writing a second pattern of data into the memory in the pseudo-random address sequence determined by the address generator are also included, wherein the second pattern of data is the complement of the first pattern. Means for reading that second pattern of data from the memory and means for checking that pattern for any error are also provided. Means for writing a third pattern of data into the memory in the pseudo-random address sequence determined by the address generator are also included, wherein the third pattern has the effect of complementing those check bits which had remained the same when the first pattern was complemented to generate the second pattern. Means for reading the third pattern from the memory and means for checking that pattern for any error are also provided.

Additional objects and features of the invention will appear from the following description in which the preferred embodiments have been set forth in detail in connection with the accompanying drawings.

BRIEF DESCRIPTION OF THE DRAWINGS

The present invention is illustrated by way of example and not limitation in the figures of the accompanying drawings, in which like references indicate similar elements, and in which:

FIG. 4 illustrates a partial sequence of memory addresses generated by the address linear feedback shift register;

FIG. 6 illustrates partial sequences of memory addresses and data generated by the address linear feedback shift register and the data linear feedback shift register;

FIG. 7 illustrates error correction code circuitry; and

FIG. 8 illustrates an error correction code.

DETAILED DESCRIPTION

Figure 1:
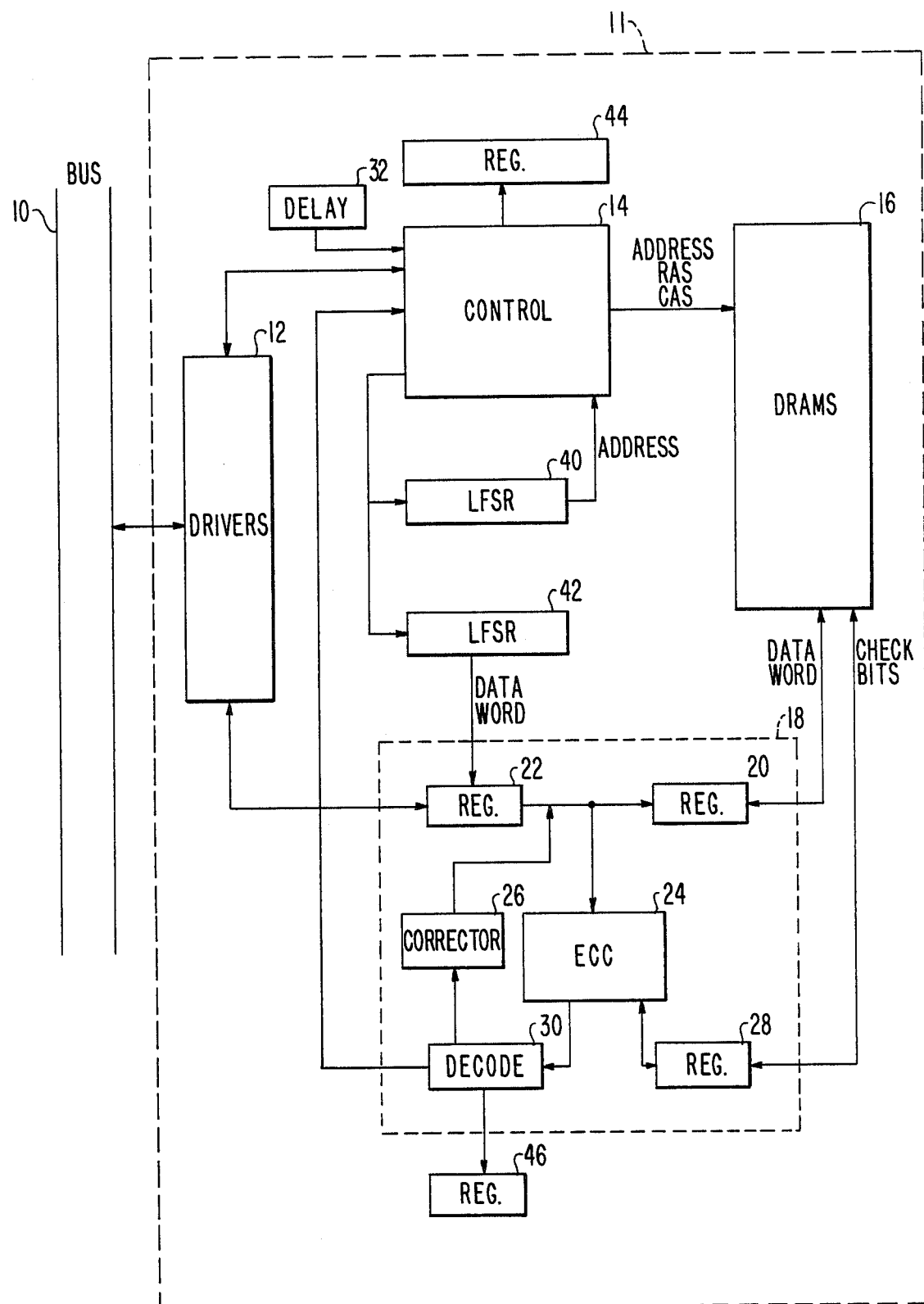
FIG. 1 is a block diagram of an embodiment for memory testing.

With reference to the drawings, FIG. 1 illustrates in block diagram form the basic apparatus for testing the memory. The bus 10 provides a path for data to be transferred throughout many parts of a computer system. Memory system 11 connects with bus 10 through the drivers 12, and data can flow to or from bus 10 through drivers 12. Control 14 contains, among other things, circuitry to interface to and observe the protocol of bus 10. Control 14 also contains circuitry to control the operation of the dynamic random access memories ("DRAMS") 16. This includes control 14 providing signals including address, row address strobe ("RAS"), and column address strobe ("CAS"). Alternatively, other types of random access memories could be used in place of the DRAMS.

In one embodiment of the present invention memory system 11 can be a memory board for use in a data processing system. In another embodiment of the present invention, the memory system 11 for use in a data processing system has at least one memory board.

Data to be written from the bus 10 into memory passes from bus 10, through the drivers 12, through data path 18, and into DRAMS 16. Data to be read from the memory onto the bus 10 passes from DRAMS 16, through data path 18, through drivers 12, and onto bus 10.

Data path 18 contains error detection and correction circuitry for the data. Register 20 stores data read from and to be wrttten into DRAMS 16. Register 22 stores data that is received from and to be sent to drivers 12. Register 28 stores parity check bits read from and to be written into DRAMS 16.

Error correction code ("ECC") circuitry 24 provides the capability for generating check bits for data words and for providing sets of syndromes for data words. The operation of ECC circuitry 24 will be described in more detail below.

Decode 30 contains circuitry to decode the syndrome produced by ECC circuitry 24. If the syndrome decoded by decode 30 indicates the presence and location of a correctable error in the data, then corrector 26 corrects the bit of the data that is in error. For example, if a bit should be a 1 rather than a 0, corrector 26 changes the bit from a 0 to a 1. Corrector 26 can of course also change a 0 to a 1.

If decode circuitry 30 detects either a correctable or an uncorrectable error, the syndrome associated with that error is stored in register 46. Alternatively, only if decode 30 detects an uncorrectable error is the syndrome associated with that error stored in register 46. Upon the detection of either a correctable error or an uncorrectable error by decode 30, decode 30 sends a signal to control 14, and control 14, after receiving that signal, stores in register 44 the memory address at which the error occurred. Alternatively, decode 30 sends a signal to control 14 for control 14 to store in register 44 the address at which an error occurred only if decode 30 detects an uncorrectable error.

FIG. 1 also illustrates a linear feedback shift register ("LFSR") 40 that generates a pseudo-random sequence of memory addresses. The pseudo-random address sequence simulates the randomness of real memory use and may stimulate failure modes not discovered by more regular sequences. LFSR 40 provides a pseudo-random address sequence for sequencing through the memory addresses in a march. Control 14 controls the enablement, disablement, and clearing of LFSR 40. The addresses generated by LFSR 40 are provided to control 14 for addressing the DRAMS 16.

Linear feedback shift register ("LFSR") 42 shown in FIG. 1 generates a pseudo-random sequence of data words to be written into the memory. The pseudo-random data sequence simulates the randomness of real memory use and may stimulate failure modes not discovered by more regular sequences. LFSR 42 provides a pseudo-random data sequence for generating a pattern of data. Control 14 controls the enablement and disablement of LFSR 42. The data output of LFSR 42 is input into register 22 of data path 18. After a data word generated by LFSR 42 is stored in register 22, check bits for the data word are then generated by ECC 24 and those check bits are stored in register 28. The data word in register 22 is then inputted into register 20. The data word stored in register 20 along with the check bits stored in register 28 are then input into DRAMS 16.

Delay circuitry 32 helps to avoid a large power transient during start-up of a memory test by providing a variable delay to the initial start of the memory self test depending on the module position in the backplane. In one embodiment of the present invention, delay circuitry 32 includes a counter to provide a count for the wait to start a memory test. The counter's count depends on which node the counter is at initially, which has the effect of staggering the initiation of memory tests which in turn helps to avoid voltage transients.

Figure 2:
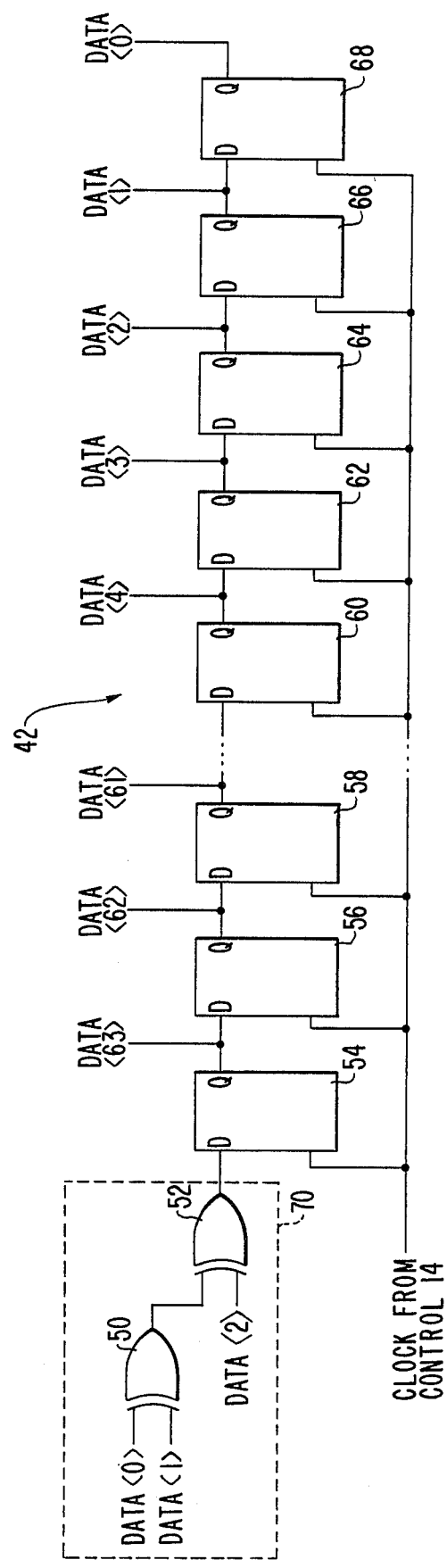
FIG. 2 illustrates the data linear feedback shift register.

FIG. 2 illustrates the LFSR 42 of FIG. 1. Again, LFSR 42 generates a pseudo-random sequence of data.

Each data word often consists of mixture of one's and zeros. LFSR 42 shown in FIG. 2 is for a 64 bit data word. A data LFSR could alternatively be provided for generating a data word with fewer than 64 bits or a data word with more than 64 bits. LFSR 42 comprises 64 flip-flops and logic circuitry. The output Q of flip-flop 54 is data bit 63, the output Q of flip-flop 56 is data bit 62, and so forth. The output Q of flip-flop 54 provides the input D for flip-flop 56, the output Q of flip-flop 56 provides the input D for flip-flop 58, and so forth. Each of the 64 flip-flops is clocked by a clock input provided by control 14 of FIG. 1. The output of a logic circuit 70 that includes exclusive-OR gates 50 and 52 is connected to input D of flip-flop 54. Data bits 0, 1, and 2 provide an input to logic circuit 70. Logic circuit 70 provides feedback for driving LFSR 42, and thus logic circuit 70 determines the particular pseudo-random data sequence for LFSR 42. The particular LFSR 42 shown in FIG. 2 can generate approximately $10^9$ combinations of data bits. A data LFSR could alternatively be provided with different feedback logic circuitry for generating different combinations of data bits.

Figure 3:
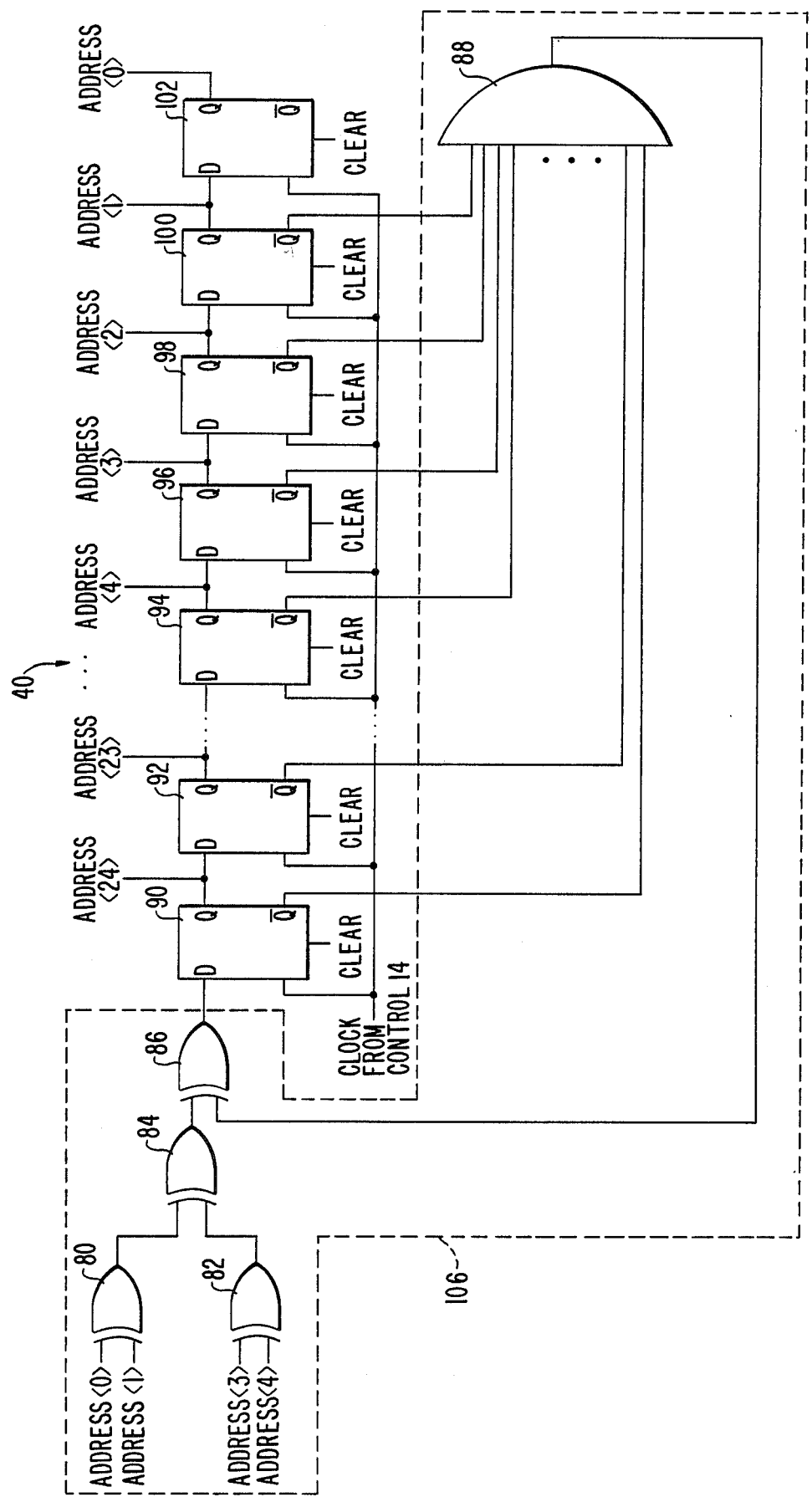
FIG. 3 illustrates the address linear feedback shift register.

FIG. 3 illustrates LFSR 40 of FIG. 1. Again, LFSR 40 generates a pseudo-random sequence of addresses which permit a march through the memory addresses. LFSR 40 shown in FIG. 3 is for a memory having a 25 bit address or 25 address lines. An address LFSR could alternatively be provided for generating addresses with fewer than 25 bits or addresses with more than 25 bits. LFSR 40 comprises 25 flip-flops and logic circuitry. The output Q of flip-flop 90 is address bit 24, the output Q of flip-flop 92 is address bit 23, and so forth. The output Q of flip-flop 90 provides the input D for flip-flop 92, and so forth. Each of the 25 flip-flops is clocked by a clock input provided by control 14 of FIG. 1. The output of a logic circuit 106 that includes exclusive-or gates 80, 82, 84, and 86, and gate 88, is connected to input D of flip-flop 90. The $\overline{Q}$ (Q-Not or Q-Bar) outputs of the 25 flip-flops are inputs to AND gate 88. Address bits 0 through 4 are also input into logic circuit 106. Logic circuit 106 provides feedback for driving LFSR 40, and thus logic circuit 40 determines the particular pseudo-random address sequence for LFSR 40. Logic circuit 106 also permits LFSR 40 to begin with an address consisting of all zeros, and nevertheless march through other addresses. The all-zero address state can be achieved by providing the CLEAR input signal to all 25 flip-flops. Logic circuit 106 also permits LFSR 40 to march through the all-zero address. It should be noted that it is not necessary that data LFSR 42 generate the all-zero data word given that many other combinations of data bits are generated. The all-zero address generated by LFSR 40, however, permits that address to be accessed during a memory test.

FIG. 4 illustrates a portion of a pseudo-random address sequence generated by LFSR 40, including the all-zero address.

Figure 5:
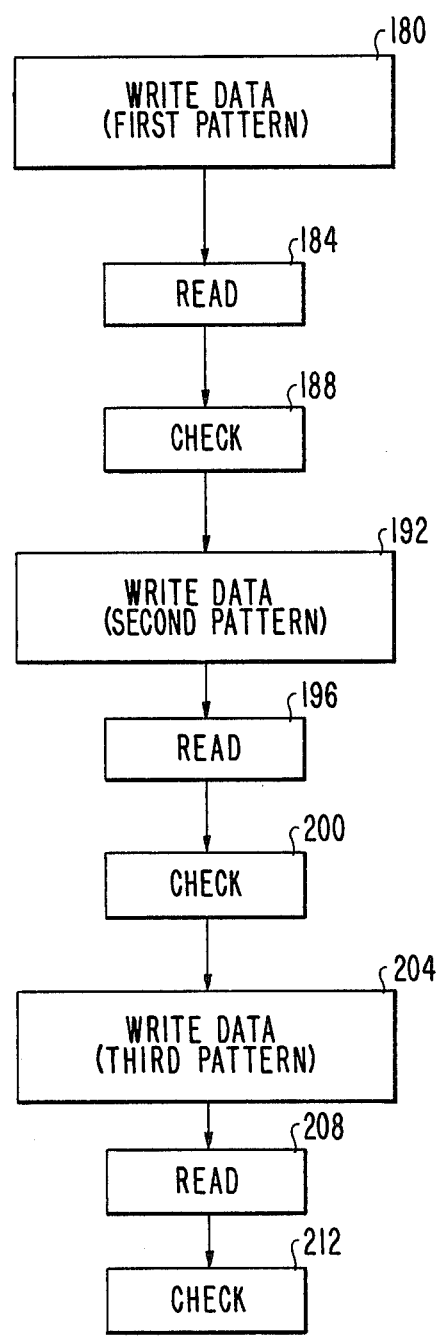
FIG. 5 illustrates a method for testing a memory.

FIG. 5 illustrates the sequence for a memory test and FIG. 1 illustrates the apparatus employed. At step 180, a first pattern of data is written into DRAMs 16 in accordance with a pseudo-random address sequence determined by LFSR 40. For each address generated by LFSR 40, data LFSR 42 generates a pseudo-random data word, which is stored in register 22. ECC circuitry 24 generates a set of check bits for the data word, and the check bits are stored in register 28. The data word is moved to and stored in register 20, and then both the data word in register 20 (generated by LFSR 42) and its check bits in register 28 are written into DRAMs 16. Address LFSR 40 then changes to another pseudo-random address, and data LFSR changes to another pseudo-random data word, and the process of writing the data word and its check bits into DRAMs 16 is likewise repeated. FIG. 6 illustrates a portion of the pseudo-random address sequences generated by LFSR 40 and a portion of the pseudo-random data words generated by LFSR 42.

Returning to FIGS. 5 and 1, as discussed above, a data word is written at a memory address, the next data word in the pseudo-random data sequence is written at the next address in the pseudo-random address sequence, and so forth, such that a first pattern of data comprising data words is written throughout the DRAMs 16.

At step 184, each data word and its check bits are in turn read from DRAMs 16 according to a pseudo-random address sequence determined by LFSR 40. The data word read from DRAMs 16 is stored in register 28. At step 188, the data word and its check bits are checked for any error. ECC circuitry 24 provides a syndrome for the data word and check bits read from the DRAMs 16. Decode circuitry 30 then decodes the syndrome produced by ECC circuitry 24. If the syndrome decoded by decode 30 indicates the presence and location of a correctable error in the data, then corrector 26 corrects the bit of the data that is in error.

If decode 30 detects either a correctable or an uncorrectable error, the syndrome associated with that error is stored in register 46. (Alternatively, only if decode 30 detects an uncorrectable error is the syndrome associated with that error stored in register 46.) Upon the detection of either a correctable error or an uncorrectable error by decode 30, decode 30 sends a signal to control 14, and control 14, after receiving that signal, stores in register 44 the memory address at which the error occurred. (Alternatively, decode 30 sends a signal to control 14 for control 14 to store in register 44 the address at which an error occurred only if decode 30 detects an uncorrectable error.)

The data word just read is then complemented by changing all the zero bits to ones and vice-versa. Check bits for the complemented data word are then generated in data path 18 in the manner described above. The complemented data word and its check bits are then written into DRAMs. The process of reading, checking, correcting (in some cases), and complementing the data word is repeated for each data word in the march through the memory addresses, the sequence of the march through the addresses being determined by the pseudo-random address sequence of LFSR 40. In that way, a second pattern of data (comprising data words)—the complement of the first pattern—is written throughout DRAMs 16, in accordance with step 192.

At step 196, each data word and its check bits are read from DRAMs 16 according to the pseudo-random address sequence determined by LFSR 40 in the manner described above in connection with step 184.

At step 200, the data word read from the DRAMs and its check bits are checked for the presence of an error in the manner described above in connection with step 188.

At step 204, a third data pattern (comprising data words) is written throughout the memory. To write the third pattern of data words, certain bits of the data word read at step 196 are complemented such that, for 64 bit data words, the third pattern of data is the same as the first pattern of data except for the fact that in the third pattern of data, bits 40 and 55 of each data word are complemented from what they were in the first pattern of data. This has the effect of complementing those check bits that had remained the same (i.e., uncomplemented) when the first pattern of data was complemented to generate the second pattern of data. Check bits are generated for the resulting new data word, and each new data word and its check bits are written into DRAMs 16, resulting in a third pattern of data being written throughout the memory.

At step 204, each data word and its check bits are read from DRAMs 16 according to the pseudo-random address sequence determined by LFSR 40 in the manner described above in connection with step 184.

At step 208, the data word read from the DRAMs and its check bits are checked for the presence of an error in the manner described above in connection with step 188.

In one embodiment of the present invention, a correctable error detected during memory testing will be flagged and the address and syndrome information will be latched for later retrieval. A subsequent correctable error will not be flagged. The address of the first correctable error will stay latched. If only a correctable error is found in the memory array, the memory will pass the self-test. An uncorrectable error will be flagged over any correctable error. The address and syndrome information will be latched in the normal manner and the self-test will have failed. Any subsequent correctable or uncorrectable error will not be flagged or latched. If another uncorrectable error is detected before the first one is cleared, a multi-error indication will be set.

FIG. 7 illustrates the ECC circuitry 24. The data word stored in register 20 is inputted into the decode circuitry 160 of the ECC circuitry 24 shown in FIG. 7. The encode circuitry 112 generates 8 parity check bits for the data word from register 20 by performing an exclusive-OR logical operation (or its logical equivalent) between certain selected bits of the data word.

The generation of check bits in the encode circuitry 160 is done according to the error correcting code ("ECC") 70 of FIG. 8. ECC 70 is a modified Hamming Code. Each check bit of the set of check bits is generated by an exclusive-OR ("XOR") operation between certain data word bits determined by ECC 70. By reference to ECC 70 of FIG. 3, one can see which data word bits determine which check bits. Each check bit has its own column in ECC 70. Each "one" in the column for the check bit of interest lines up with a bit position of a data word. The data word bit positions so associated with the "ones" in the column of interest become the pertinent bit positions. For example, for check bit S2, the pertinent data word bit positions are 4-7, 12-13, 20-23, 28-29, 36-39, 44-46, 52-55, and 60-62. A check bit is generated by an exclusive-OR operation between the data in the pertinent bit positions of the data word. For this example, check bit S2 is generated by an exclusive-OR operation between the data in bit positions 4-7, 12-23, 20-23, 28-29, 36-39, 44-46, 52-55, and 60-62 of a data word. The 8 check bits resulting from the generation of check bits in the encode circuitry 160 are stored in register 162.

The 8 check bits stored in register 28 that were read from memory are then inputted through gate 166 into exclusive-OR circuitry 164. Exclusive-OR circuitry 164 generates a syndrome by performing an exclusive-OR logical operation between corresponding bits of each set of check bits inputted into the exclusive-OR circuitry 164.

The syndrome generated by exclusive-OR circuitry 164 is then inputted into decode 30 of FIG. 1. The decode circuitry 30 performs logical operations on the syndrome to determine:

(1) whether there is no error in the data word stored in register 20 or the check bits sored in register 28;

(2) whether the data and check bits stored in registers 20 and 28 have a correctable error, and if so, the location within that data of the bit in error;

(3) whether the data words and check bits stored in registers 20 and 28 have an uncorrectable error; and (4) whether a failed partial write operation has occurred.

The assumption is made, however, given the power of ECC 70 of FIG. 8, that there are no errors involving three or more bits of the data word.

For a "write to memory" operation, the check bits of register 162 pass through gate 166 and are stored in register 28.

In an alternative embodiment of the present invention, a comparator rather than error correcting code circuitry is used to check data for errors. In a memory tester employing a comparator rather than error correcting code circuitry in memory testing, for each pattern of data in the memory, the comparator detects whether or not there is any error in the data read from the memory.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for testing a memory comprising the steps of:
   writing a first pattern of data into the memory in a pseudo-random address sequence determined by an address generator;
   reading the first pattern from the memory;
   checking the first pattern for any error;
   writing a second pattern of data into the memory in the pseudo-random address sequence determined by the address generator, wherein the second pattern of data is the complement of the first pattern;
   reading the second pattern from the memory;
   checking the second pattern for any error;
   writing a third pattern of data into the memory in the pseudo-random address sequence determined by the address generator, wherein the third pattern has the effect of complementing respective check bits which are the same for the first pattern and the second pattern, and wherein check bits are associated with each data pattern;
   reading the third pattern from the memory; and
   checking the third pattern for any error.

2. The method recited in claim 1, further comprising the step of indicating whether or not an error has occurred.

3. The method recited in claim 1, further comprising the step of storing the memory address at which an error occurs.

4. The method recited in claim 1, wherein the data comprises a plurality of data words, wherein each data word in generated in a pseudo-random data sequence determined by a data generator.

5. The method recited in claim 4, wherein each data word comprises 72 bits including 8 check bits.

6. The method recited in claim 1, wherein the writing of a first pattern of data into the memory occurs after a delay from the time power is first applied to the memory in order to avoid a power transient.

7. A method for testing a memory comprising the steps of:

generating a pseudo-random data sequence of first data words;

generating sets of first check bits wherein a respective one of each of the sets of first check bits is generated from a respective one of each of the first data words;

addressing the memory in a pseudo-random address sequence of memory addresses;

writing into the memory the first data words and the sets of first check bits, wherein a respective one of each of the first data words and the set of first check bits generated from that respective one of the first data words is written at a respective one of each of the addresses in the pseudo-random address sequence so that a first pattern of the first data words is written in the memory;

reading from the memory each of the first data words and each set of the first check bits;

decoding each of the first data words and each set of the first check bits in order to detect the presence of an error;

generating second data words by complementing each of the first data words read from the memory;

generating sets of second check bits wherein a respective one of each of the sets of second check bits is generated from a respective one of each of the second data words;

writing into the memory the first data words and sets of first check bits, wherein a respective one of each of the second data words and the set of second check bits generated from that respective one of the second data words is written at a respective one of each of the addresses in the pseudo-random address sequence so that a second pattern of second data words is written in the memory.

reading from the memory each of the second data words and each set of the second check bits;

decoding each of the second data words and each set of the second check bits in order to detect the presence of an error;

generating third data words;

generating sets of third check bits wherein a respective one of each of the sets of second check bits is generated from a respective one of each of the second data words and wherein each of the third data words is formed by complementing a subset of a respective one of each of the second data words so that the sets of third check bits are such that the bits of the third check bits that correspond in bit position to respective bits of the sets of the first and second check bits that are the same are the complements of those bits;

writing into the memory the third data words and sets of third check bits, wherein a respective one of each of the third data words and the set of third check bits generated from that respective one of the third data words is written at a respective one of each of the addresses in the pseudo-random address sequence so that a third pattern of third data words is written in the memory;

reading from the memory each of the third data words and each of set of the third check bits; and decoding each of the third data words and each set of the third check bits in order to detect the presence of an error.

8. The method recited in claim 7, further comprising the step of indicating whether or not an error has occurred.

9. The method recited in claim 7, further comprising the step of storing the address at which an error occurs.

10. The method recited in claim 7, wherein the first, second and third data words are comprised of 64 bits respectively and wherein each set of the first, second and third check bits is comprised of 8 bits.

11. The method recited in claim 7, wherein the writing into memory of the first data words and the sets of first check bits occurs after a delay from the time power is first applied to the memory in order to avoid a power transient.

12. An apparatus for testing a memory comprising:

means for writing a first pattern of data into the memory in a pseudo-random address sequence determined by an address generator;

means for reading the first pattern from the memory;

means for checking the first pattern for any error;

means for writing a second pattern of data into the memory in the pseudo-random address sequence determined by the address generator, wherein the second pattern of data is the complement of the first pattern;

means for reading the second pattern from the memory;

means for checking the second pattern for any error;

means for writing a third pattern of data into the memory in the pseudo-random address sequence determined by the address generator, wherein the third pattern has the effect of complementing respective check bits which are the same for the first pattern and the second pattern, and wherein check bits are associated with each data pattern;

means for reading the third pattern from the memory; and means for checking the third pattern for any error.

13. The apparatus recited in claim 12, further comprising means for indicating whether or not an error has occurred.

14. The apparatus recited in claim 12, further comprising means for storing the memory address at which an error occurs.

15. The apparatus recited in claim 12, wherein the data comprises a plurality of data words, wherein each data word is generated in a pseudo-random data sequence determined by a data generator.

16. The apparatus recited in claim 15, wherein the data generator is a linear feedback shift register.

17. The apparatus recited in claim 12, wherein the address generator is a linear feedback shift register that can address a memory address zero as part of a pseudo-random address sequence.

18. The apparatus recited in claim 12, wherein each data word comprises 72 bits including 8 check bits.

19. The apparatus recited in claim 12, further comprising means for delaying the writing of a first pattern of data into the memory after power is first applied to the memory in order to avoid a power transient.

* * * * *